United States Patent [19]
Wood et al.

[11] Patent Number: 5,440,240
[45] Date of Patent: * Aug. 8, 1995

[54] Z-AXIS INTERCONNECT FOR DISCRETE DIE BURN-IN FOR NONPACKAGED DIE

[75] Inventors: Alan G. Wood, Boise; Warren M. Farnworth, Nampa; David R. Hembree, Boise, all of Id.

[73] Assignee: Micron Technology, Inc., Boise, Id.

[*] Notice: The portion of the term of this patent subsequent to Apr. 12, 2011 has been disclaimed.

[21] Appl. No.: 788,065

[22] Filed: Nov. 5, 1991

Related U.S. Application Data

[63] Continuation-in-part of Ser. No. 709,858, Jun. 4, 1991, abandoned.

[51] Int. Cl.⁶ .............................................. G01R 31/02
[52] U.S. Cl. ..................................... 324/765; 324/755
[58] Field of Search ............. 324/158 R, 158 F, 73.1, 324/754, 755, 158.1; 439/68, 70, 91; 437/8; 257/40, 48

[56] References Cited

U.S. PATENT DOCUMENTS

| | | | |
|---|---|---|---|
| 4,340,860 | 7/1982 | Teeple, Jr. ...................... | 324/158 F |
| 4,554,505 | 11/1985 | Zachry ............................ | 324/158 F |
| 4,560,216 | 12/1985 | Egawa ............................. | 324/158 F |
| 4,729,166 | 3/1988 | Lee et al. ........................ | 439/86 |
| 4,739,257 | 4/1988 | Jenson et al. ................... | 324/158 F |
| 4,899,107 | 2/1990 | Corbett et al. .................. | 324/158 F |
| 4,996,476 | 2/1991 | Balyasny et al. ................ | 324/158 F |
| 5,140,405 | 8/1992 | King et al. ...................... | 357/67 |
| 5,302,891 | 4/1994 | Wood et al. ..................... | 324/158 F |

OTHER PUBLICATIONS

"Known-Good Die: A Key to Cost-Effective MCMs", Cloud et al., Electronic Packaging and Production, Sep. 1992.

Military Sram Die, *Micron Military Products Data Book*, 1992, pp. 61–614.

*Primary Examiner*—Vinh Nguyen
*Attorney, Agent, or Firm*—Stan Protigal; Stephen A. Gratton

[57] ABSTRACT

A reusable burn-in/test fixture for discrete die consists of two halves. The first half of the test fixture contains cavity in which die is inserted. Electrical contact with bondpads or bumps on the die is established through a Z-axis anisotropic conductive interconnect material. When the two halves are assembled, electrical contact with the die is established. The fixture establishes the electrical contact and with a burn-in oven and with a discrete die tester. The test fixture need not be opened until the burn-in and electrical tests are completed. The fixture permits the die to be characterized prior to assembly, and the Z-axis anisotropic conductive interconnect material permits the die to then be transferred in an unpackaged form.

20 Claims, 10 Drawing Sheets

Z-AXIS INTERCONNECT FOR DISCRETE DIE BURN-IN FOR NONPACKAGED DIE

CROSS-REFERENCE TO RELATED APPLICATION

This is a continuation-in-part to U.S. patent application Ser. No. 7/709,858, filed Jun. 4, 1991.

BACKGROUND OF THE INVENTION

1. Field of the Invention

This invention relates to electrical test equipment for semiconductor devices. More specifically, the invention relates to an apparatus and method, which utilize conductive polymers, and which are used to perform dynamic burn-in and full electrical/performance/speed testing on discrete nonpackaged or semi-packaged dice.

2. Background of the Invention

Semiconductor devices are subjected to a series of test procedures in order to assure quality and reliability. This testing procedure conventionally includes "probe testing" in which individual dice, while still on a wafer, are initially tested to determine functionality and speed. Probe cards are used to electrically test die at that level. The electrical connection interfaces with only a single die at a time in wafer; not discrete die.

If the wafer has a yield of functional dice which indicates that quality of the functional dice is likely to be good, each individual die is assembled in a package to form a semiconductor device. Conventionally, the packaging includes a lead frame and a plastic or ceramic housing.

The packaged devices are then subjected to another series of tests, which include burn-in and discrete testing. Discrete testing permits the devices to be tested for speed and for errors which may occur after assembly and after burn-in. Burn-in accelerates failure mechanisms by electrically exercising the devices (UUT) at elevated temperatures, thus eliminating potential failures which would not otherwise be apparent at nominal test conditions.

Variations on these procedures permit devices assembled onto circuit arrangements, such as memory boards, to be burned-in, along with the memory board in order to assure reliability of the circuit, as populated with devices. This closed assembly testing assumes that the devices are discretely packaged in order that it can then be performed more readily.

It is proposed that multiple integrated circuit devices be packaged as a single unit. This can be accomplished with or without conventional lead frames. This creates two problems compared to conventional test methods. Firstly, discrete testing is more difficult because the conventional lead frame package is not used. Furthermore, when multiple devices are assembled into a single package, the performance of the package is reduced to that of the die with the lowest performance. In other words, the ability to presort the individual dice is limited to that obtained through probe testing. Secondly, the packaging may have other limitations which are aggravated by burn-in stress conditions so that the packaging becomes a limitation for burn-in testing.

A form of hybrid integrated circuit incorporates a plurality of dice in a single package. This increases density of packaging and permits matched components on different dice to be packaged as a single part. The yield rate of such an assembly is likely to be at least a multiple of the yield rates of its component dice resulting in a lower overall yield. As mentioned, if performance of the dice is factored in, the yield is likely to become significantly lower than the multiple of the component yield rates.

On the other hand, if the test results of burned in dice are available, the component yield rates can be increased. It is further possible to match components by matching various characterizations (such as signal timing and response times), thereby providing more margin for proper response in the completed assembly.

Such hybrid integrated circuits, as well as other configurations establish a need for burned in semiconductor dice. Ideally, it would be desirable to permit testing of individual dice in a manner similar to that accomplished with discrete packaged semiconductor devices.

In U.S. Pat. No. 4,899,107, commonly assigned, a reusable burn-in/test fixture for discrete TAB die is provided. The fixture consists of two halves, one of which is a die cavity plate for receiving semiconductor dice as the units under test (UUT); and the other half establishes electrical contact with the dice and with a burn-in oven.

The first half of the test fixture contains cavities in which die are inserted circuit side up. The die will rest on a floating platform. The second half has a rigid high temperature rated substrate, on which are mounted probes for each corresponding die pad. Each of a plurality of probes is connected to an electrical trace on the substrate (similar to a P.C. board) so that each die pad of each die is electrically isolated from one another for high speed functional testing purposes. The probe tips are arranged in an array to accommodate eight or sixteen dice.

The two halves of the test fixture are joined so that each pad on each die aligns with a corresponding probe tip. The test fixture is configured to house groups of 8 or 16 die for maximum efficiency of the functional testers.

There are some testing and related procedures when the parts are singulated. For this reason, it is inconvenient to retain multiple die in a single test fixture.

TAB tape is normally bonded at bondpads in order to establish electrical connections which exhibits long term reliability without requiring that external pressure be applied to the assembly. The bonding of the TAB tape establishes a mechanical connection which can cause the bond pads to lift off of (become detached from) the die when the TAB tape is removed.

The bondpads are conductive areas on the face of the die which are used as an interconnect for connecting the circuitry on the die to the outside world. Normally, conductors are bonded to the bondpads, but it is possible to establish electrical contact through the bondpads by biasing conductors against the bondpads without actual bonding.

One of the problems encountered with burn in and full characterization testing of unpackaged die is the physical stress caused by connection of the bondpads to an external connection circuitry. This problem is complicated by the fact that in many die configurations, the bondpads are recessed below the surface level of a passivation layer. The passivation layer is a layer of low eutectic glass, such as BPSG, which is applied to the die in order to protect circuitry on the die.

SUMMARY OF THE INVENTION

It has been found desireable to perform testing and related procedures in discrete fixtures prior to final assembly. In order to accomplish this, a two piece reusable burn-in/test fixture for discrete die is provided. The fixture consists of two halves, one of which is a die cavity plate for receiving a semiconductor die as the units under test (UUT).

A Z-axis anisotropic conductive interconnect material is used to establish ohmic contact with bondpads or the equivalent attach points on the semiconductor die. The Z-axis anisotropic conductive interconnect material is able to conform to the shape of the die at the bondpad sufficiently to establish the ohmic contact without substantially damaging the bondpad. Since contact is able to be established by biasing force, it is possible to perform burn in and test of the die without resorting to bonding a conductor to the bondpad.

The Z-axis anisotropic conductive interconnect material is a metal filled polymer composite which is able to function as a compliant interconnection material for connector and testing applications. This material is in a group of materials which are referred to as elastomeric conductive polymer interconnect (ECPI) materials. These are available from AT&T Bell Laboratories, of Allentown, Pa., or Shin Etsu Polymer America Inc., of Union City, Calif.

In a first embodiment, a die is placed face up in a cavity in a first half of the fixture. TAB (tape automated bonding) tape is used to conduct signals between bondpad locations and external connector leads on the fixture. The TAB tape is able to establish contact with the external connector leads, or with other leads on the fixture which are in communication with the external connector leads. In order to establish contact between the bondpads and the TAB tape, Z-axis anisotropic conductive interconnect material is placed between the die and the TAB tape at the bondpad locations.

The contact between the bondpads and the external connector leads is therefore established by utilizing the Z-axis anisotropic conductive interconnect material and TAB tape. Conductors on the Z-axis anisotropic conductive interconnect material and TAB tape extend from the bondpads to connection points, and the connection points conduct to contacts, which are in turn in communication with the external connector leads.

The Z-axis anisotropic conductive interconnect material and TAB tape is essentially similar to conventional TAB interconnect methods, except that its connection function may be performed without permanently bonding the TAB tape to the die. In order to maintain contact with circuitry on the die, the Z-axis anisotropic conductive interconnect material and TAB tape is biased against the die when the burn-in/test fixture is assembled. The non-bonded contact of the Z-axis anisotropic conductive interconnect material and TAB tape applies primarily to the die pads. Contact between the tape and other conductors may also be non-bonded contact, although the attachment of the TAB tape to the fixture may be effected either without permanent bonding, or by bonding techniques. The Z-axis anisotropic conductive interconnect material is biased against the die, either by a separate compressible elastomeric pad, or by the elastomeric property of the Z-axis anisotropic conductive interconnect material.

In the preferred form of that embodiment, the external connector leads are connector pins, which preferably are in a DIP (dual inline package) or QFP (quad flat pack) configuration. The pins terminate at the connection points.

In an alternate form of that embodiment, the conductors on the TAB tape conduct to the top of the tape, and attachment of the second half of the fixture establishes an electrical connection between the conductors and the external connection leads, either through the second half or through a separate conductor.

The fixture establishes electrical contact with the a single die and with a burn-in oven, as well as permitting testing of dice in discretely packaged form.

In another embodiment of the invention, a two piece reusable burn-in/test fixture for discrete die is provided. The first half of the test fixture contains a cavity in which a die is inserted circuit side up. The die will rest on a floating platform. The second half has a probe for each die pad. Each probe is connected to an electrical connector which can be used for attachment to a burn-in board and may be used for connection to a discrete circuit tester. The Z-axis anisotropic conductive interconnect material is placed directly against the bondpads and establishes an interface between the probes and the die. Advantageously, the probes exert pressure on the Z-axis anisotropic conductive interconnect material, which establishes a good ohmic contact with the bondpads.

The probes can take several forms. Deposited conductors would be similar to the use of TAB tape, except that the deposited conductors could be located on a fixed substrate. Conductive elastomers may be used, in which case, the conductive elastomers cooperate with the Z-axis anisotropic conductive interconnect material in order to bias the Z-axis anisotropic conductive interconnect material against the bondpads. Alternatively biased metal probes, such as probe wires, may be used, and would also cooperate with the Z-axis anisotropic conductive interconnect material in biasing the Z-axis anisotropic conductive interconnect material against the bondpads.

In a third embodiment, the die is placed face up in a cavity in a first half of the fixture. A second half of the fixture includes external connector leads and is used to establish contact with bondpads on the die. Attachment of the die to the external connection leads is established either through contact points on the second half through the Z-axis anisotropic conductive interconnect material, or through an intermediate member such as TAB tape, which establishes contact with the Z-axis anisotropic conductive interconnect material.

In a fourth embodiment, the die is placed face down in a fixture which includes die receiving cavity. The Z-axis anisotropic conductive interconnect material is placed in the die receiving cavity beneath the die and contact with bondpads on the die are established through the Z-axis anisotropic conductive interconnect material, with external connector leads on the fixture.

In that embodiment, the probes, the Z-axis anisotropic conductive interconnect material and the electrical connector are located on the second half. In the preferred form of that embodiment, the electrical connector extends upward from the face of the circuit side of the die, so that the fixture is normally connected to a tester with the integrated circuit side of the die facing down.

DETAILED DESCRIPTION OF THE PREFERRED EMBODIMENT

Figure 1:
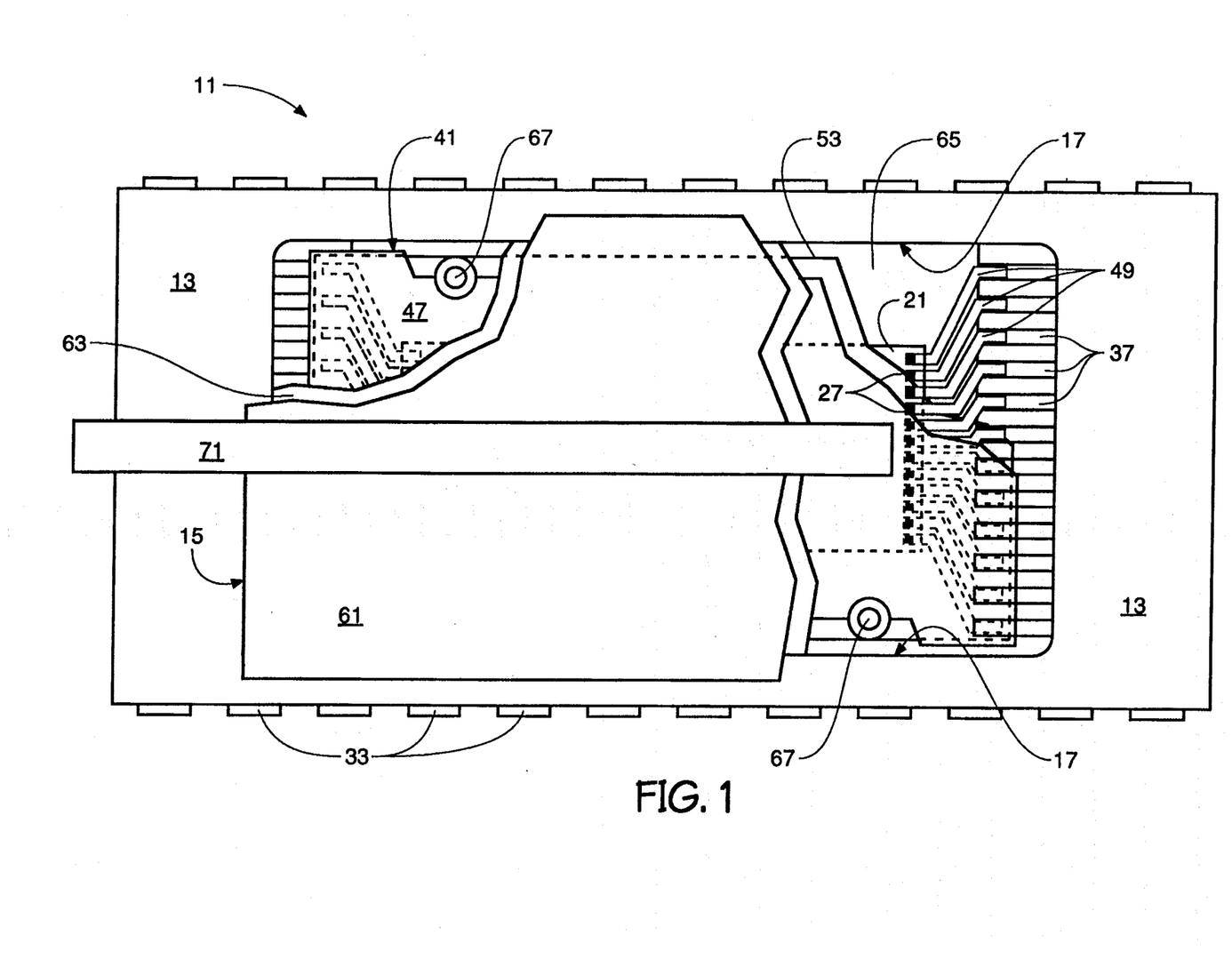
FIGS. 1 and 2 show a preferred embodiment of the inventive burn-in fixture.
Figure 2:
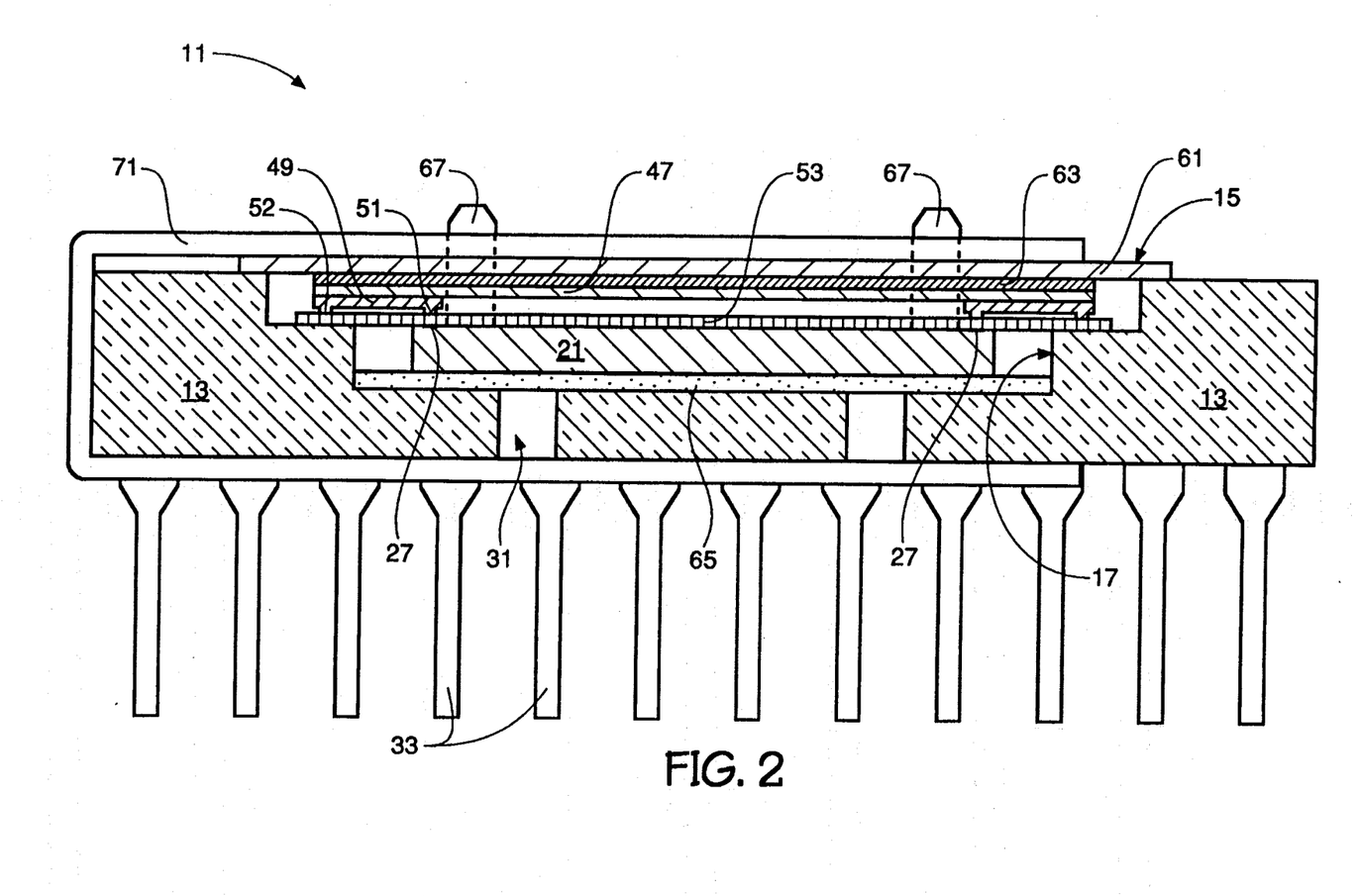

Referring to FIGS. 1 and 2, the inventive burn-in fixture 11 includes a die cavity plate, 13 and a cover 15. The die cavity plate 13 includes a die receiving cavity 17.

The die receiving cavity 17 has dimensions which are at least sufficient to accommodate a die 21. The die 21 is to be connected at bondpads 27, which are typically 0.1 mm wide. The die cavity plate 13 has a slot 31 which permits convenient access to the bottom of the die 21 in order that the die 21 may be lifted out of the die receiving cavity 17. Alignment of the die 21 in the die cavity plate 13 is achieved by aligning the cover 15 to the bondpad 27.

A plurality of external connector leads 33 extend from the burn in fixture 11. As can be seen in FIG. 2, in the preferred embodiment, the external connector leads 33 are attached to the die cavity plate 13 and extend therefrom. The external connector leads 33 are shown as connector pins, which preferably are in a DIP (dual inline package) or QFP (quad flat pack) configuration.

The external connector leads 33 are secured by the die cavity plate 13 and terminate on the die Cavity plate 13 with contact pads 37. The contact pads 37 are in approximate planar alignment with the bondpads 27.

Figure 4:
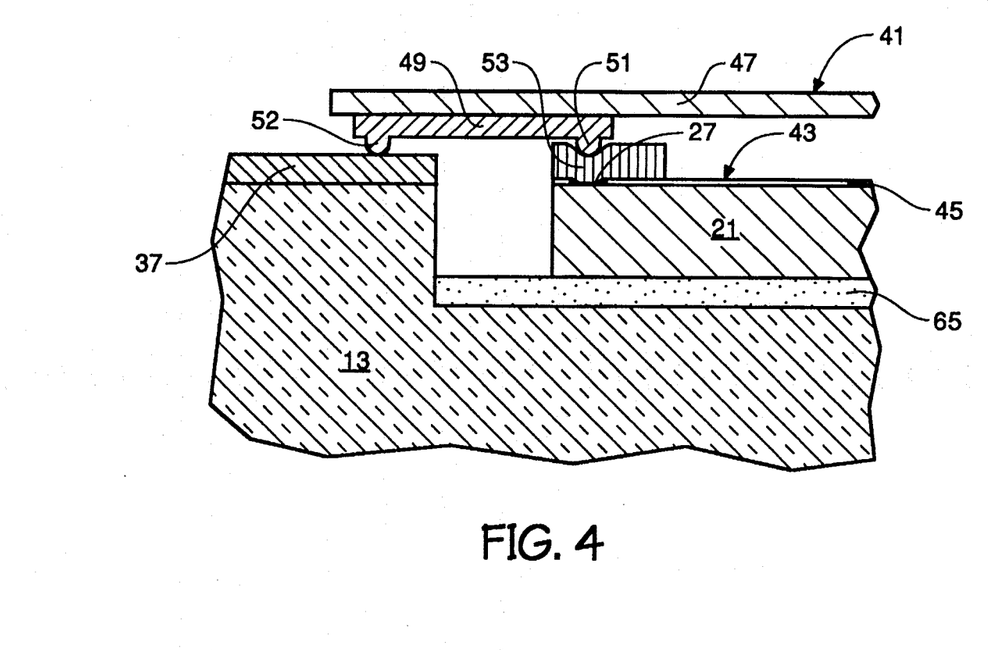
FIG. 4 shows details of Z-axis anisotropic conductive interconnect material and TAB tape in cross-section.

Referring to FIGS. 1 and 2, TAB (tape automated bonding) tape 41 is used to extend between the contact pads 37 on the die cavity plate 13 and the bondpads 27. The bondpads, as can be seen in FIG. 4, are typically recessed below a top surface level 43, established by a passivation layer 45.

Figure 3:
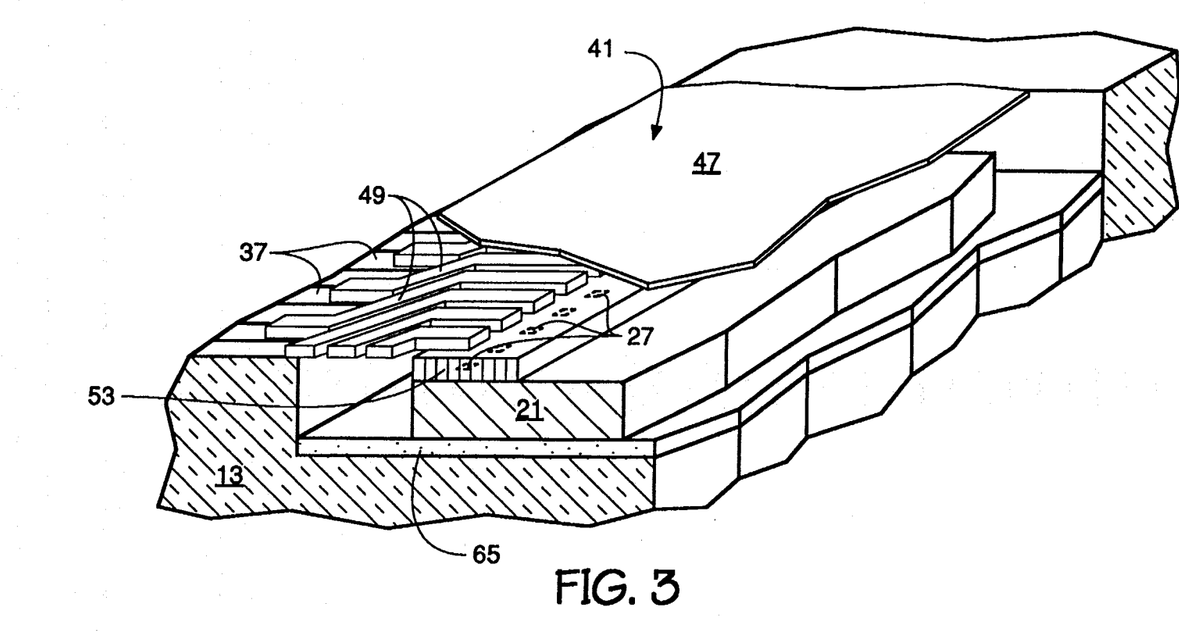
FIG. 3 shows details of Z-axis anisotropic conductive interconnect material and TAB tape used with one embodiment of the invention.

The TAB tape 41 includes a plastic film 47, preferably formed of polyimide, onto which are formed a plurality of conductive traces 49. Referring also to FIG. 2, the conductive traces 49 have bumps 51, 52 which are intended for registration with a bondpad 27 or a contact pad 37. The conductive traces 49 therefore are able to conduct signals between the bondpads 27 and the contact pads 37, provided that ohmic contact is established between the bondpads 27 and contact pads 37 and the respective bumps 51, 52. As to contact between bump 52 and the contact pads 37, this would simply be a matter of applying biasing force to urge the TAB tape 41 against the contact pads 37. The bondpads 27, on the other hand, are quite another story.

The bondpads 27 are in some cases recessed beneath the top surface of the die, as a result of the application of the passivation layer 45. The bondpads 27 also tend to be fragile. A Z-axis anisotropic conductive interconnect material 53 is used to provide an interface between the bondpad 27 and the TAB tape 41. This permits ohmic contact to be made through the Z-axis anisotropic conductive interconnect material 53, rather than directly between the TAB tape 41 and the bondpads 27. Conveniently, the Z-axis anisotropic conductive interconnect material is also able to extend between the TAB tape 41 and the contact pads 37, thereby also facilitating the connection of the TAB tape 41 to the contact pads 37.

The use of the Z-axis anisotropic conductive interconnect material 53 between the bondpads 27 and the TAB tape 41 performs several functions. The ability of the Z-axis anisotropic conductive interconnect material to resiliently deform permits it to distort sufficiently to reach into the recesses defined by the bondpads 27. The compliant nature of the Z-axis anisotropic conductive interconnect material 53 permits ohmic contact to be made with the bondpads 27 with a minimum of damage to the bondpads. This is important in the burn in and testing of unpackaged die because it is desired that the bondpads remain substantially undamaged subsequent to burn in and testing. The compliant nature of the Z-axis anisotropic conductive interconnect material 53 permits an intermediate contact member such as the TAB tape 41 to be slightly misaligned with the bondpads 27. As long as there is a sufficient amount of material in the conductive path beneath the TAB tape 41 which is also in contact with the bondpads 27, ohmic contact will be established. It is also necessary to provide a biasing force to maintain ohmic contact. While the biasing force may be achieved by using a further elastomeric pad, the elastomeric nature of the Z-axis anisotropic conductive interconnect material 53 is also able to provide biasing force.

Significantly, the Z-axis anisotropic conductive interconnect material 53 need not be permanently bonded to the bondpads 27. Ohmic contact is established by biasing force. This enables the Z-axis anisotropic conductive interconnect material 53 and TAB tape 41 to be lifted from the die 21 without destroying the bondpads 27.

The Z-axis anisotropic conductive interconnect material 53 and TAB tape 41 therefore are able to conduct signals between the bondpads 27 and the contact pads 37.

It is also possible to permanently bond the Z-axis anisotropic conductive interconnect material 53 and the TAB tape 41 to the die 21, and to retain the attachment to the TAB tape 41 to the die 21 subsequent to burn in.

The cover 15 includes a rigid cover plate 61 and an optional resilient compressible elastomeric strip 63, which serves as a resilient biasing member. When the cover plate 61 is secured to the die cavity plate 13, the elastomeric strip 63 biases the Z-axis anisotropic conductive interconnect material 53 and TAB tape 41 against the die 21. This establishes an ohmic contact between the bondpads 27 and the conductive traces on the TAB tape 41, without the TAB tape 41 being bonded to the bondpads 27.

It has been found that an optimum technique for temporarily securing the die 21 in place in the die cavity plate 13 is the use of a precured RTV silicone strip, commonly known as "gel pack," as a backing strip 65. The backing strip 65 exhibits a static charge sufficient and coefficient of friction sufficient to hold the die 21 in place without adhesive, and also is elastomeric. In other words, the silicone holds the silicon in place and biases the silicon against the TAB tape 41 and cover plate 61.

The elastomeric strip 63 is considered optional because it has been found that an optimum technique for temporarily securing the die 21 in place in the die cavity plate 13 is the use of the precured RTV silicone strip as a backing strip 65. With the use of the use of the backing strip 65, the die 21 therefore is biased against the TAB tape 41 even without the use of the elastomeric strip 63, provided that the distances are appropriately selected to effect biasing.

The non-bonded contact of the Z-axis anisotropic conductive interconnect material 53 is significant at the bondpads 27. Contact between the TAB tape 41 and the contact pads 37 on the fixture 11 may be effected by bonding techniques. Such bonding is not expected to deteriorate the fixture 11, even though the fixture is used multiple times. If bonding is used for such contact, then the conductive material from the TAB tape may remain with the fixture 11, but without detriment to the operation of the fixture 11.

Positioning pins 67 are used to align the cover plate 61 with the die cavity plate 13. A clamp 71 then secures the cover plate 61 in place over the die cavity plate 13. The clamp 71 may consist of a wire clasp which may either be latched into place against itself, as shown, or is fitted into parallel horizontal locations in the die cavity plate 13 and the cover plate 61. With the cover plate 61 in place, conductors on the TAB tape 41 extend from the bondpads 27 to the location of contact pads 37, so that the bondpads 27 are in electrical communication with the external connector leads 33.

Figure 5:
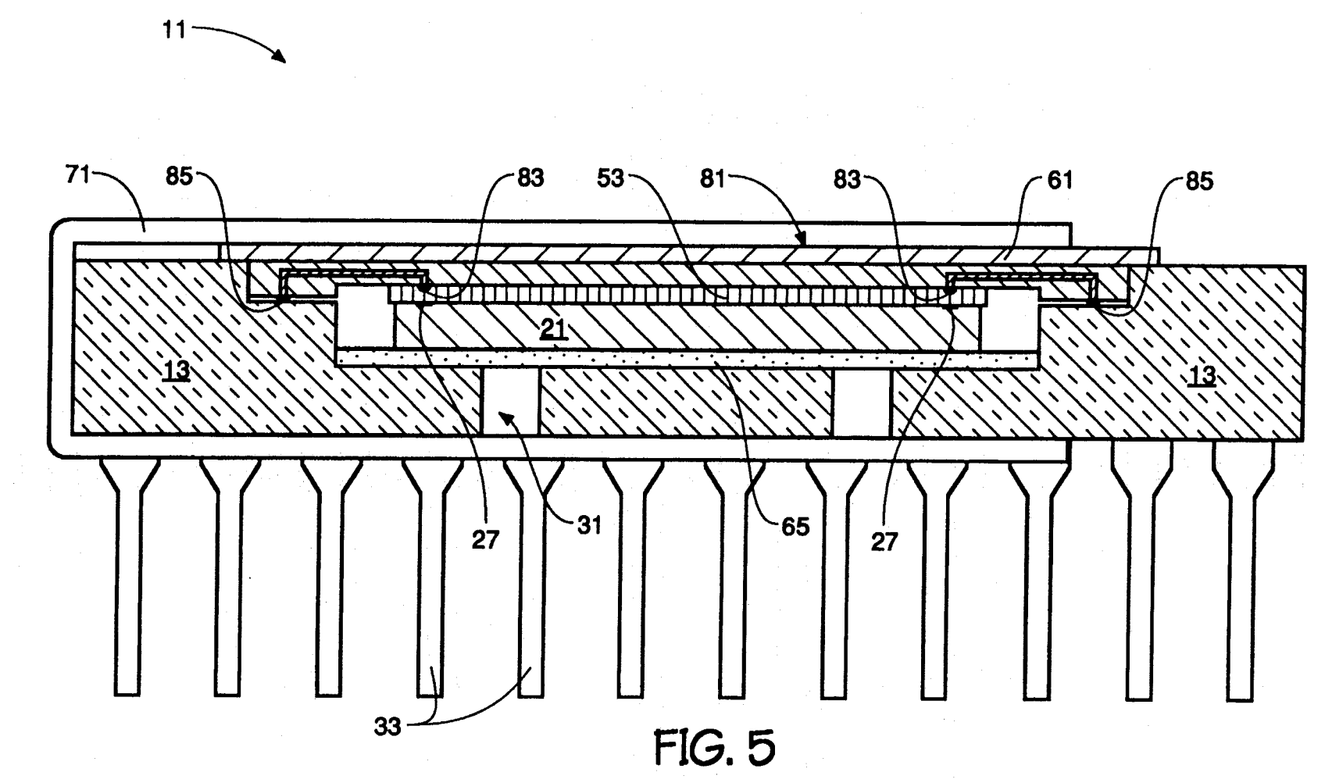
FIG. 5 shows a modification to the embodiment of FIGS. 1 and 2, in which a modified cover plate has intermediate contact members.

FIG. 5 shows a modification to the embodiment of FIGS. 1 and 2, in which a modified cover plate 81 uses intermediate contacts 83 in order to establish contact with the Z-axis anisotropic conductive interconnect material 53 in the region of the bondpads 27. Contact with the external connector leads 33 is established by electrical contacts 85 on the cover plate 81. This contact may be either with the Z-axis anisotropic conductive interconnect material 53, with conductive polymer or by direct metal to metal connection.

Figure 6:
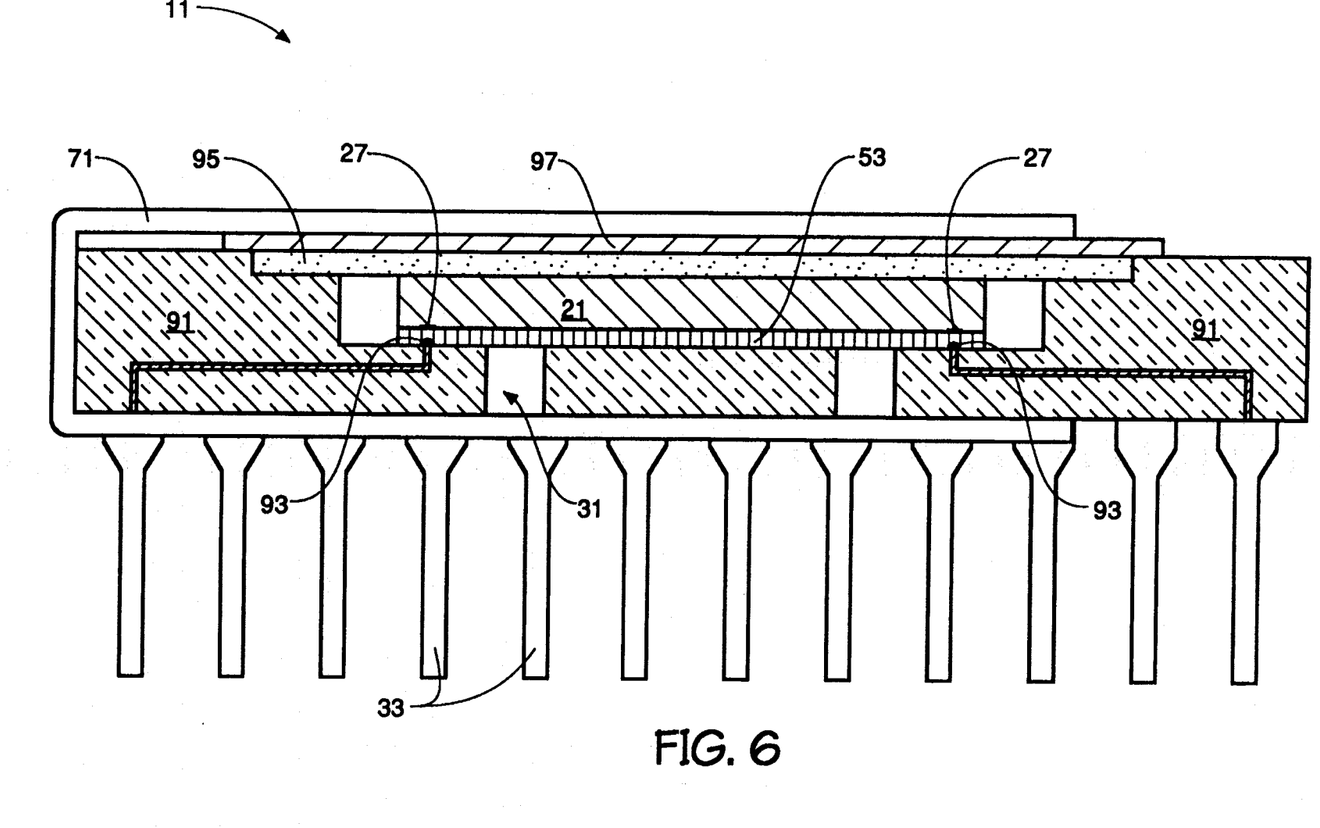
FIG. 6 shows an embodiment in which a die cavity housing is used for connections between the die and external connection pins.

FIG. 6 shows an embodiment in which a die cavity housing 91 has intermediate contacts 93. The die 21 is placed face down, so as to establish connection between the bondpads 27 and intermediate contacts 93. The Z-axis anisotropic conductive interconnect material 53 in this case is beneath the die 21. A precured RTV silicone backing strip 95 is used to secure the die 21 to a cover plate 97 and to bias the die 21 against the intermediate contacts 93.

Figure 7:
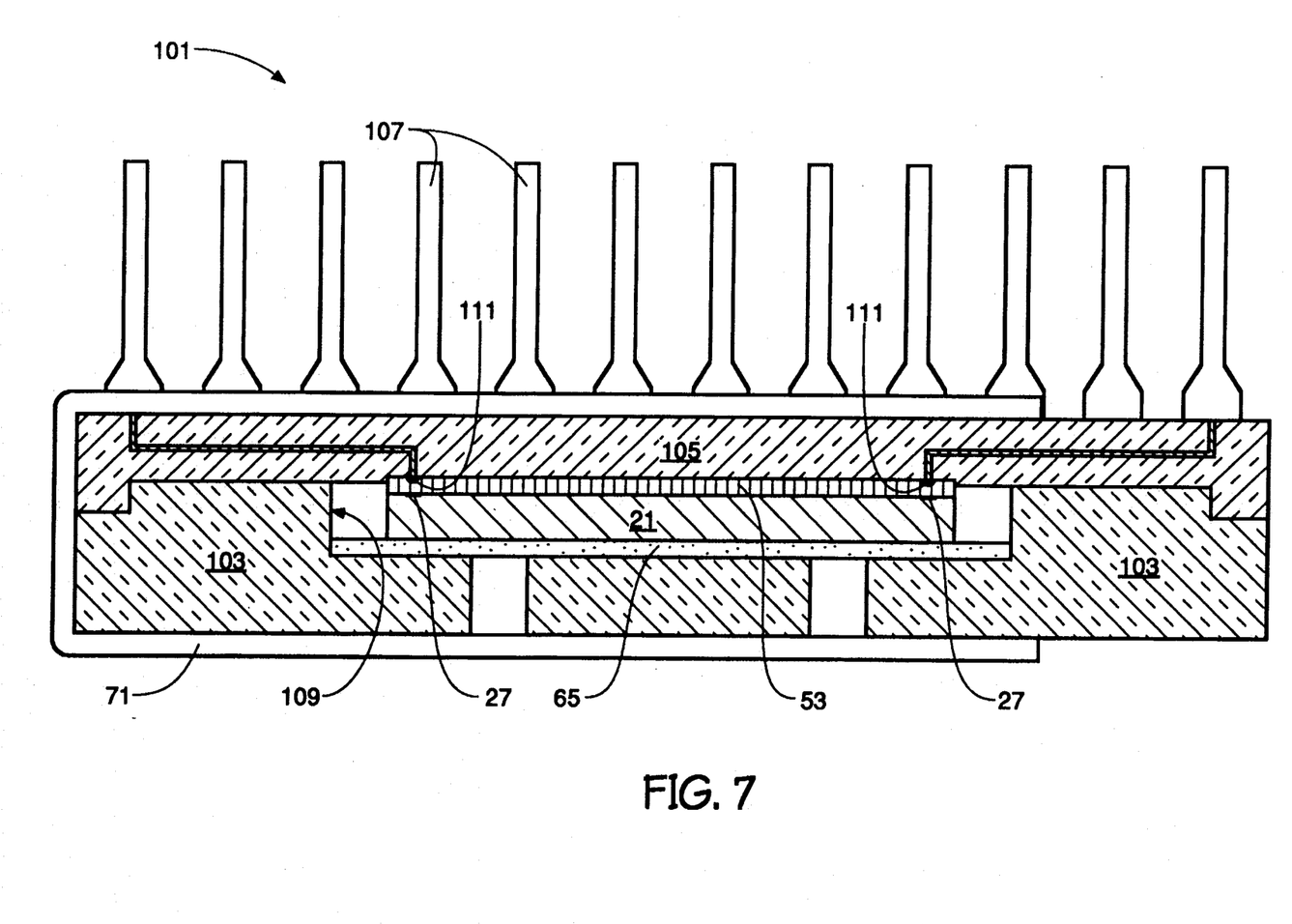
FIG. 7 shows an alternate embodiment of a test package, in which an upper portion is used to connect the die to external test circuitry.

In an alternate embodiment of a package 101, shown in FIG. 7, a die receiving housing 103 is used to retain a die 21, and an upper portion 105 is used to connect the die 21 to external test circuitry, by the use of external connector pins 107. The die receiving housing 103 contains a die receiving cavity 109, which supports the die 21 in alignment with electrical contacts 111 which align with bondpads 27 on the die 21. The Z-axis anisotropic conductive interconnect material 53 is positioned between the die 21 and the upper portion 105, so that the electrical connection is established between the bondpads 27 and the contacts 111, and hence with the connector pins 107. In one embodiment of this configuration, the contacts 111 are metallic, although other conductors may be used for the contacts 111. As an example, it is possible to use conductive polymer for the contacts 111.

Figure 8:
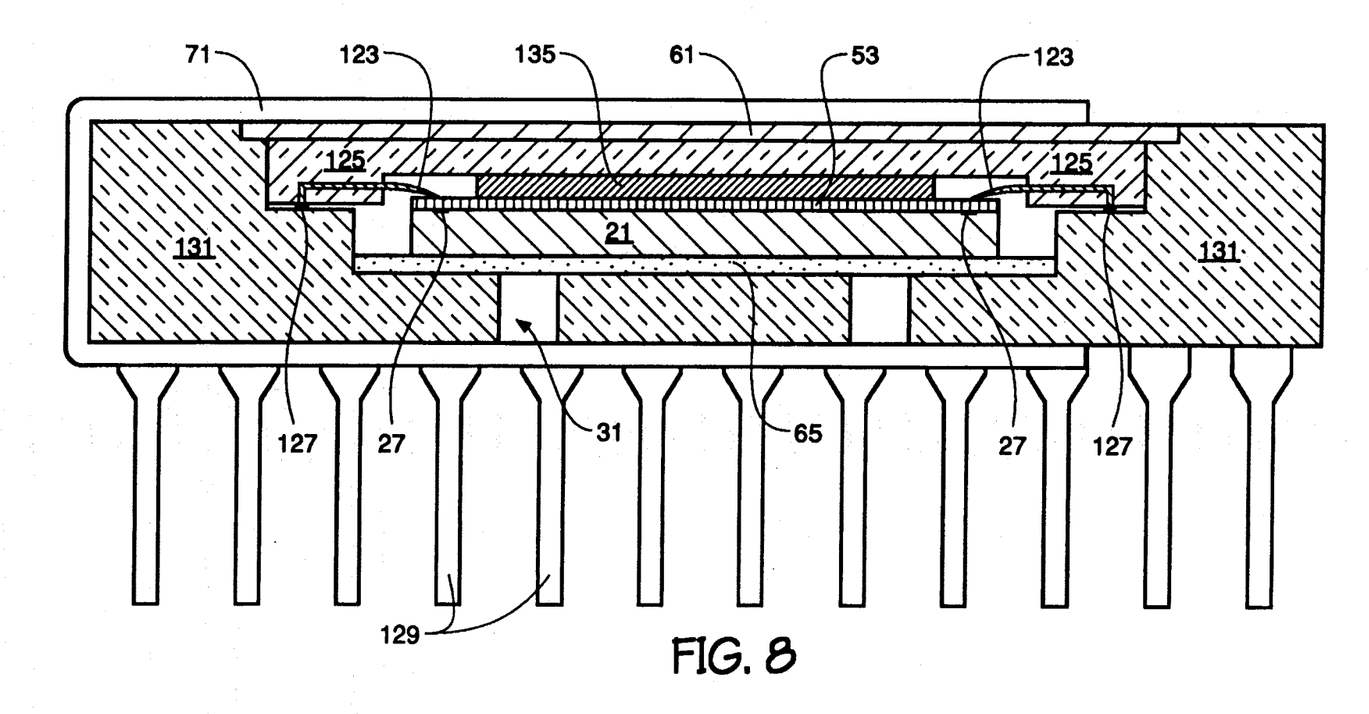
FIG. 8 shows a modification to the embodiment of FIGS. 1 and 2, in which a modified cover plate has probe wire contacts.

In an embodiment shown in FIG. 8, contact pins 123 extend to the Z-axis anisotropic conductive interconnect material 53 at the locations of the bondpads 27 on the die 21. The contact pins 123 are mounted to a dielectric cover 125, and electrical continuity between the contact pins 123 and base portions 127 of external connector pins 129 is established when the cover 125 is mounted to a die cavity housing 131. An optional top elastomeric strip 135 may be used to further secure the die 21 in position in the housing 131.

The contacts 123 are pin type contacts, which are similar to probe contacts. Because of the relatively precise alignment of the cover 125 with respect to the die 21, it is possible to design the contacts 123 to have a relatively low biasing force, while still maintaining sufficient force to cause the Z-axis anisotropic conductive interconnect material 53 to establish good ohmic contact with the bondpads 27.

Figure 9:
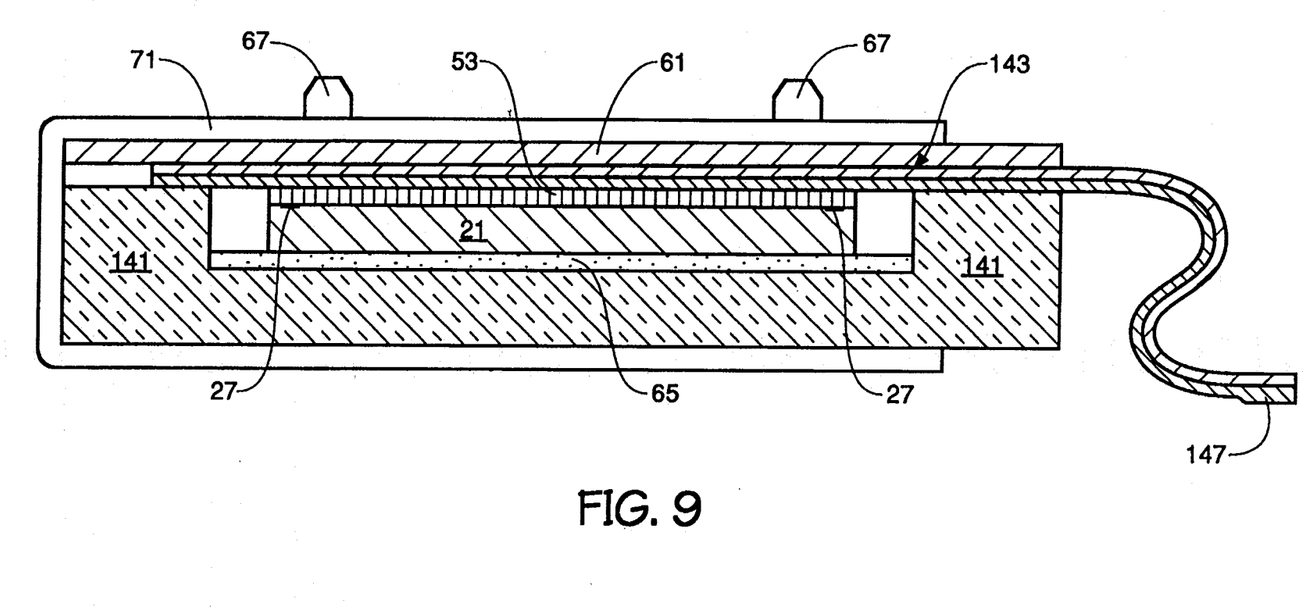
FIG. 9 shows a modification of the invention, in which flexible tape and the Z-axis anisotropic conductive interconnect material are used to directly connect the die to an external connector connected to external test circuitry.

FIG. 9 shows a configuration in which a housing fixture 141 merely retains the die 21, and in electrical communication with TAB tape 143. The TAB tape 143 extends beyond the confines of the fixture 141 and terminates in an external connector 147. The Z-axis anisotropic conductive interconnect material 53 is positioned between the TAB tape 143 and the die 21, so as to establish contact with the diepads 27.

Figure 10:
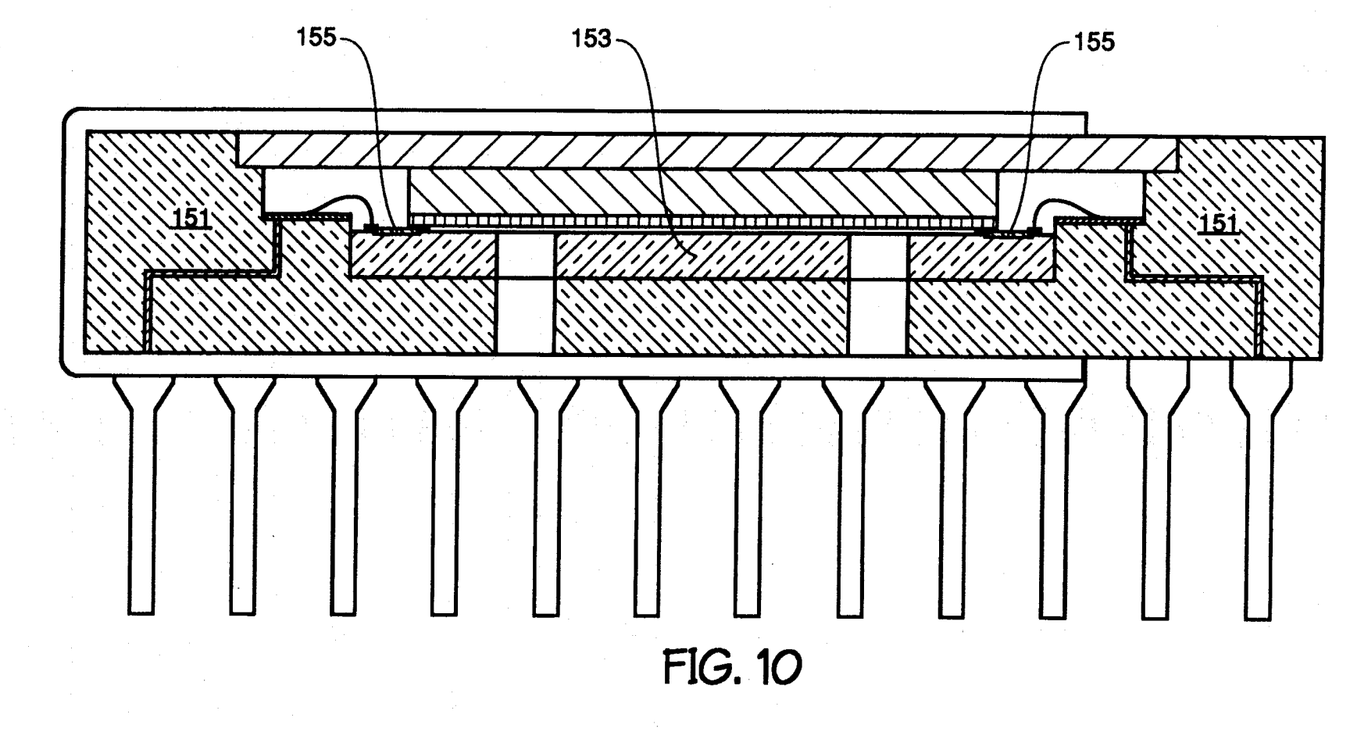
FIG. 10 shows the use of an insulative substrate within a die cavity housing.

FIG. 10 shows a housing fixture 151, with a substrate 153 formed of an insulator material. The substrate 153 has a plurality of conductors 155 thereon and is located adjacent to the die within the die receiving cavity. The Z-axis anisotropic conductive interconnect material 53 is positioned over the die 53 between the die and the plurality of conductors 155. When the die 53 and the substrate 153 are positioned in the die-receiving cavity, the conductors 155 communicate with bondpads on the die 23.

While specific locations for bondpads had not been specified, it is possible to test a variety of configurations, including the conventional arrangement of bondpads at the ends of the die 21. The invention may also be used for testing die configured for LOC (leads over chip), as well as other designs. In each of the above examples, the assembled fixture is adapted into conventional test equipment, such as a burn-in oven. What has been described is a very specific configuration of a test fixture. Clearly, modification to the existing apparatus can be made within the scope of the invention. Accordingly, the invention should be read only as limited by the claims.

We claim:

1. Discrete testing apparatus for testing a semiconductor integrated circuit device in die form, comprising:
   a) a first plate;
   b) a die-receiving cavity in the first plate for receiving a semiconductor die;
   c) a second plate mating with the first plate;
   d) one of the first and second plates having a plurality of ohmic contacts formed thereon;
   e) the plurality of ohmic contacts formed so that, when the die is positioned in the die-receiving cavity, the ohmic contacts are in alignment with contact locations on the die;

f) an elastically resilient pad which is electrically conductive in a z-axis, normal to a plane of the pad, and which provides electrical isolation cross the plane of the pad, the pad adapted for positioning in contact with the die between the die and the plurality of ohmic contacts;

g) electrical connector terminals in electrical communication with the ohmic contacts, the electrical connector terminals being mounted to the one of said plates; and h) biasing means comprising a second pad mounted between the second plate and die for biasing the die against the pad to etablish an electrical connection between the ohmic contacts and the contact locations on the die.

2. Discrete testing apparatus as described in claim 1, wherein:
the biasing means comprises a second elastomeric pad mounted within the die receiving cavity and formed of a material that exerts an electrostatic attraction on the die.

3. Discrete testing apparatus as described in claim 1, wherein:
the contacts include flexible rods which extend into the die receiving cavity after the first and second plates have been mated.

4. Discrete testing apparatus as described in claim 1, wherein:
the contacts include flexible rods which extend into the die receiving cavity after the first and second plates have been mated.

5. Discrete testing apparatus for testing a semiconductor device in die form, comprising:
a) a first plate;
b) a die-receiving cavity in the first plate for receiving a semiconductor die;
c) a second plate;
d) means to secure the first and second plates together;
e) an intermediate member including a substrate formed of insulative material, said intermediate member dimensioned so as to fit between the first and second plate adjacent to the die when the die is in the die receiving cavity;
f) a pad which is electrically conductive in a z-axis normal to a plane of the pad, and which provides electrical isolation across the plane of the pad, the pad being positioned over the die between the die and the substrate;
g) a plurality of ohmic contacts formed on the intermediate member the ohmic contacts being positioned so that, when the first plate and the second plate are aligned and the die and said substrate are positioned in the die-receiving cavity, the ohmic contacts are in alignment with contact locations on the die, for establishing an electrical connection with the die at the contact locations;
h) electrical connector terminals in an electrical communication with the plurality of ohmic contacts; and
i) a clamp to hold the die, the pad, and said intermediate member together when the first plate and the second plate are secured together, thereby causing the ohmic contacts to be maintained in electrical communication with said contact locations, when the first and second plates are secured together with the die in the die receiving cavity.

6. Discrete testing apparatus as described in claim 5, wherein:
said electrical connector terminals are positioned on the second plate.

7. Discrete testing apparatus as described in claim 6, wherein:
said intermediate member is formed as tape automated bonding (TAB) tape.

8. Discrete testing apparatus as described in claim 7, wherein:
the TAB tape extends beyond the confines of a fixture formed by the first and second plates and terminating in an external connector, the external connector including said connector terminals.

9. Discrete testing apparatus as described in claim 5, wherein:
said pad is elastically resilient, thereby biasing against the die received in the die receiving cavity with the ohmic contacts after the first and second plates have been mated.

10. Discrete testing apparatus as described in claim 5, wherein:
means are provided, separate from said pad, to bias die received in the die receiving cavity with the ohmic contacts after the first and second plates have been mated, the means to bias cooperating with said pad to apply sufficient pressure between said pad and said contact locations on the die to establish ohmic contact between said pad and said contact locations on the die.

11. Discrete testing apparatus as described in claim 5, wherein:
the die receiving cavity has an elastomeric pad therein, the elastomeric pad exerting a biasing force against the die, the biasing force cooperating with said pad in order to establish an electrical connection, through said pad, between the contact locations on the die and said plurality of ohmic contacts.

12. Discrete testing apparatus as described in claim 11, wherein:
the elastomeric pad comprises an elastomeric polymer.

13. Discrete testing apparatus as described in claim 5, wherein:
said ohmic contacts include ohmic contacts which are in alignment with the die receiving cavity after the first and second plates have been mated and cooperating with said pad to apply sufficient pressure between said pad and said contact locations on the die to establish ohmic contact between said pad and said contact locations on the die.

14. Discrete testing apparatus as described in claim 5, wherein:
a) an elastomeric strip is provided, separate from said pad, cooperating with said pad to bias die received in the die receiving cavity with the ohmic contacts after the first and second plates have been mated, and to apply sufficient pressure between said pad and said contact locations on the die to establish ohmic contact between said pad and said contact locations on the die; and
b) the elastomeric strip further secures the die in a position within the die receiving cavity by means of electrostatic attraction and frictional forces, thereby permitting the die to be maintained in a positional alignment with respect to the die receiving cavity after being placed into the die receiving cavity and prior to mating the second plate with the first plate.

15. Discrete testing apparatus as described in claim 5, wherein:

the contacts include flexible rods which extend into the die receiving cavity after the first and second plates have been mated.

16. Discrete testing apparatus as described in claim 5, wherein:

said ohmic contacts each include a contact pad which is in alignment with the die receiving cavity after the first and second plates have been mated.

17. Discrete testing apparatus for testing a semiconductor device in die form, comprising:
a) a first plate;
b) a die-receiving cavity in the first plate for receiving a semiconductor die;
c) a second plate;
d) means to secure the first and second plates together;
e) an intermediate member formed of insulative material, and having a plurality of conductors formed thereon and dimensioned so as to fit within the testing apparatus between the first and second plate and adjacent to the die when the die is in the die receiving cavity, the plurality of conductors including ohmic contacts for establishing an electrical connection with the die at the contact locations;
f) a pad which is electrically conductive in a Z-axis, normal to a plane of the pad, and which provides electrical isolation across the plane of the pad, the pad being positioned over the die between the die and the plurality of conductors;
g) electrical connector terminals in electrical communication with the plurality of conductors; and
i) a clamp to hold the die, the pad, and, said intermediate member together when the first plate and the second plate are secured together, thereby causing the plurality of conductors to be maintained in electrical communication with said contact locations.

18. Discrete testing apparatus for testing a semiconductor integrated circuit in device die form, comprising:
a) a first plate;
b) a die-receiving cavity in the first plate for receiving a semiconductor die;
c) a second plate mating with the first plate;
d) one of the first and second plates having a plurality of ohmic contacts thereon;
e) the plurality of ohmic contacts being positioned so that when the die is positioned in the die-receiving cavity, the ohmic contacts are in alignment with contact locations on the die, the ohmic contacts thereby establishing an electrical connection with the die at the contact locations;
f) a pad which is electrically conductive in a z-axis, normal to a plane of the pad, and which provides electrical isolation across the plane of the pad, the pad being positioned over the die between the die and the plurality of ohmic contacts;
g) electrical connector terminals in electrical communication with the ohmic contacts, the electrical connector terminals being mounted to the one of said plates;
h) an elastomeric strip, mounted within the die receiving cavity cooperating with said pad to bias the die in the die receiving cavity with the ohmic contacts after the first and second plates have been mated, and to apply sufficient pressure between said pad and said contact locations on the die to establish ohmic contact between said pad and said contact locations on the die
said elastomeric strip formed of a material that exerts an electrostatic attraction on the die.

19. Discrete testing apparatus as described in claim 18, wherein:

said pad is elastically resilient, thereby biasing against the die received in the die receiving cavity with the ohmic contacts after the first and second plates have been mated.

20. Discrete testing apparatus as described in claim 18, wherein:

the ohmic contacts include ohmic contacts which are in alignment with the die receiving cavity after the first and second plates have been mated, said ohmic contacts cooperating with said pad to apply sufficient pressure between said pad and said contact locations on the die to establish ohmic contact between said pad and said contact locations on the die.

* * * * *